(12) United States Patent
Seneviratne et al.

(10) Patent No.: US 9,112,458 B2
(45) Date of Patent: Aug. 18, 2015

(54) WIDEBAND DOHERTY AMPLIFIER

(71) Applicant: Telefonaktiebolaget L M Ericsson (publ), Stockholm (SE)

(72) Inventors: Sashieka Seneviratne, Ottawa (CA); Igor Spokoinyi, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/093,766

(22) Filed: Dec. 2, 2013

(65) Prior Publication Data

US 2015/0091651 A1    Apr. 2, 2015

Related U.S. Application Data

(60) Provisional application No. 61/885,315, filed on Oct. 1, 2013.

(51) Int. Cl.
| | |
|---|---|
| *H03F 3/68* | (2006.01) |
| *H03F 1/42* | (2006.01) |
| *H03F 1/02* | (2006.01) |

(52) U.S. Cl.
CPC ............... *H03F 1/42* (2013.01); *H03F 1/0288* (2013.01)

(58) Field of Classification Search
CPC .................................. H03F 1/07; H03F 1/0288
USPC .................................. 330/295, 124 R, 84, 126
See application file for complete search history.

(56) References Cited

U.S. PATENT DOCUMENTS

| | | | |
|---|---|---|---|
| 4,490,695 | A | 12/1984 | de Ronde |
| 5,274,341 | A | 12/1993 | Sekine et al. |
| 7,602,241 | B2 | 10/2009 | Suzuki et al. |
| 8,193,857 | B1 | 6/2012 | Wilson |

(Continued)

FOREIGN PATENT DOCUMENTS

| | | |
|---|---|---|
| EP | 1551079 A1 | 7/2005 |
| EP | 2421093 A1 | 2/2012 |
| WO | 2009067054 A1 | 5/2009 |

OTHER PUBLICATIONS

Ang, Kian Sen et al., "A Broad-Band Quarter-Wavelength Impedance Transformer With Three Reflection Zeros Within Passband," IEEE Transactions on Microwave Theory and Techniques, vol. 52, No. 12, Dec. 2004, pp. 2640-2644.

(Continued)

*Primary Examiner* — Henry Choe
(74) *Attorney, Agent, or Firm* — Withrow & Terranova, PLLC

(57) ABSTRACT

Embodiments of a low-complexity and potentially physically small wideband impedance transformer that can be used in a combining network of a wideband Doherty amplifier are disclosed. In one embodiment, a wideband Doherty amplifier includes Doherty amplifier circuitry and a wideband combining network. The wideband combining network includes a wideband quarter-wave impedance transformer that includes a quarter-wave impedance transformer and compensation circuitry connected in parallel with the quarter-wave impedance transformer at a low-impedance end of the quarter-wave impedance transformer. The compensation circuitry is configured to reduce a total quality factor of the wideband quarter-wave impedance transformer as compared to a quality factor of the quarter-wave impedance transformer, which in turn increases a bandwidth of the wideband quarter-wave impedance transformer, and thus a bandwidth of the wideband Doherty amplifier.

19 Claims, 9 Drawing Sheets

(56) References Cited

U.S. PATENT DOCUMENTS

| | | | |
|---|---|---|---|
| 8,237,506 B1* | 8/2012 | Bowles et al. | 330/295 |
| 8,314,654 B2* | 11/2012 | Outaleb et al. | 330/124 R |
| 8,339,201 B1 | 12/2012 | Wilson et al. | |
| 8,384,482 B2 | 2/2013 | Wilson et al. | |
| 8,390,392 B2 | 3/2013 | Nagai et al. | |
| 8,576,010 B2* | 11/2013 | Yanduru et al. | 330/295 |
| 8,717,099 B2 | 5/2014 | Wilson et al. | |
| 8,896,373 B2 | 11/2014 | Mei | |
| 2011/0169590 A1* | 7/2011 | Namerikawa et al. | 333/136 |
| 2011/0279178 A1* | 11/2011 | Outaleb et al. | 330/124 R |
| 2012/0038432 A1 | 2/2012 | Andrews | |
| 2012/0092074 A1 | 4/2012 | Yanduru et al. | |
| 2013/0093534 A1 | 4/2013 | Mei | |

OTHER PUBLICATIONS

Cristal, Edward G., "Meander-Line and Hybrid Meander-Line Transformers," IEEE Transactions on Microwave Theory and Techniques, vol. MTT-21, No. 2, Feb. 1973, pp. 69-76.

Drozd, J. Michael et al., "Determining Q Using S Parameter Data," IEEE Transactions on Microwave Theory and Techniques, vol. 44, No. 11, Nov. 1996, pp. 2123-2127.

Li, Haitao et al., "Overlay Inductor Aids Power Amplifier Match," Microwave & RF, vol. 44, No. 10, Oct. 2005, 7 pages.

Matthaei, G.L., "Short-Step Chebyshev Impedance Transformers," IEEE Transactions on Microwave Theory and Techniques, vol. 14, No. 8, Aug. 1966, IEEE, pp. 372-383.

Monzon, Cesar, "A Small Dual-Frequency Transformer in Two Sections," IEEE Transactions on Microwave Theory and Techniques, vol. 51, No. 4, Apr. 2003, IEEE, pp. 1157-1161.

Nesic, A. et al., "A New Small Size Wideband Impedance Transformer," 7th International Conference on Telecommunications in Modern Satellite, Cable and Broadcasting Services, vol. 1, Sep. 28-30, 2005, pp. A163-A166.

Pozar, David M., "Microwave Engineering," Book Excerpt, 3rd Edition, Chapter 6: Microwave Resonators, John Wiley & Sons, Inc., 2005, pp. 266-271.

Xiang, Zhou et al., "Design of Broadband Impedance Transformer Using Coupled Microstrip Transmission Lines," 3rd IEEE International Symposium on Microwave, Antenna, Propagation and EMC Technologies for Wireless Communications, Oct. 27-29, 2009, Beijing, China, pp. 994-997.

Grebennikov, Andrei, et al., "A Dual-Band Parallel Doherty Power Amplifier for Wireless Applications," IEEE Transactions on Microwave Theory and Techniques, vol. 60, No. 10, Oct. 2012, 9 pages.

Rawat, Karun, et al., "Double the Band and Optimize," IEEE Microwave Magazine, vol. 12, Mar. 9, 2012, pp. 69-82.

Rubio, Jorge M., et al., "3-3.6-GHz Wideband GaN Doherty Power Amplifier Exploiting Output Compensation Stages," IEEE Transactions on Microwave Theory and Techniques, vol. 60, No. 8, Jun. 2012, 6 pages.

International Search Report and Written Opinion for PCT/IB2014/064768, mailed Jan. 29, 2015, 10 pages.

* cited by examiner

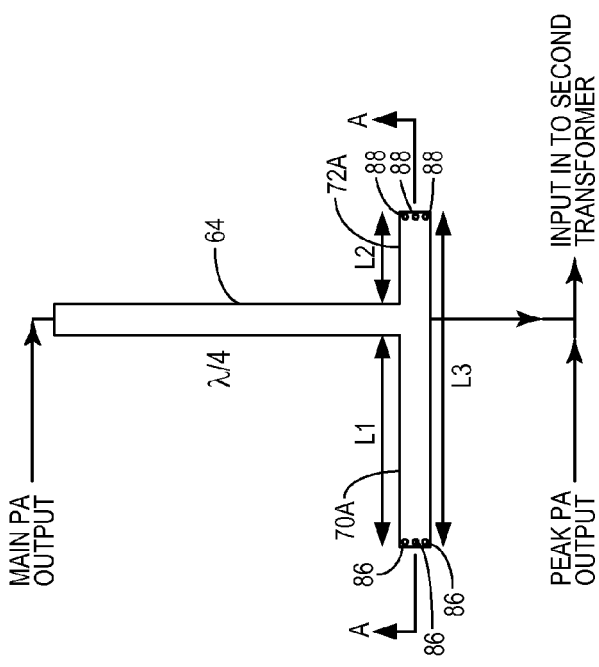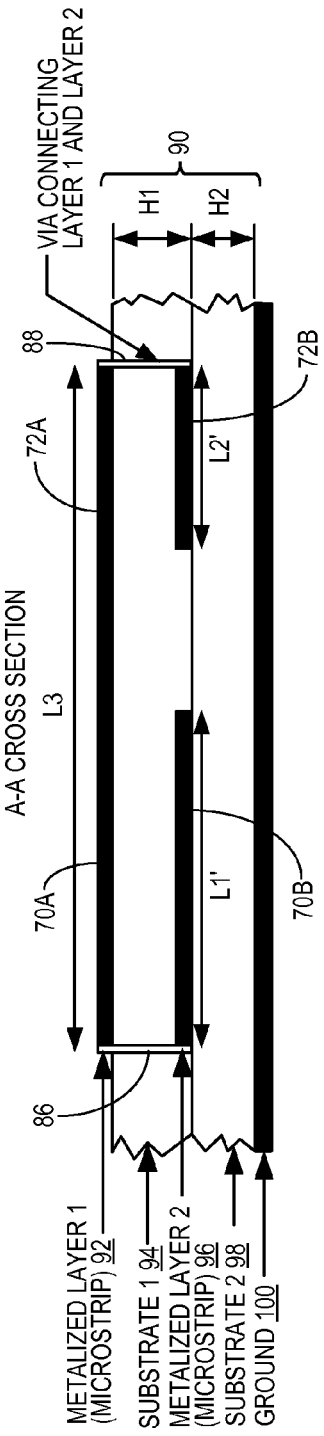

WIDEBAND DOHERTY AMPLIFIER

RELATED APPLICATIONS

This application claims the benefit of provisional patent application Ser. No. 61/885,315, filed Oct. 1, 2013, the disclosure of which is hereby incorporated herein by reference in its entirety.

FIELD OF THE DISCLOSURE

The present disclosure relates to a Doherty amplifier and, in particular, a wideband Doherty amplifier.

BACKGROUND

Base stations in modern and next generation cellular communications networks transmit wideband signals. As such, a Power Amplifier (PA) of such as base station must be able to achieve wide, or broad, bandwidths that cover more than 10% relative frequency bandwidth (i.e., greater than 10% bandwidth relative to a center frequency of operation). Notably, relative frequency bandwidth is defined as $\Delta f/f_o$, where $\Delta f = (f_H - f_L)$, $f_o = [(f_H + f_L)/2]$, and $f_H$ and $f_L$ are an upper frequency and a lower frequency that define the outer edges of the bandwidth of operation. The most common high efficiency power amplifier architecture that is currently being implemented is the Doherty amplifier. As illustrated in FIG. 1, a conventional Doherty amplifier 10 includes a splitter 12, a class AB main amplifier 14, a class C or class B peaking amplifier 16, and a combining network 18 (sometimes referred to as a "Doherty combining network") connected as shown. An efficiency enhancement of the Doherty amplifier 10 is implemented through load modulation of the main amplifier 14 from the peaking amplifier 16 at peak and back-off power levels. This load modulation is implemented through the combining network 18, which typically consists of two $\lambda/4$ (quarter wavelength) impedance transformers 20 and 22 with a high transformation ratio connected between the main and peaking amplifiers 14 and 16 and an external load 24 as shown. Due to the inherent band limiting characteristics of the $\lambda/4$ impedance transformers 20 and 22, the Doherty amplifier 10 tends to only support a narrow bandwidth (1-5% relative bandwidth) that is catered for a specific band of operation.

There are several existing approaches to design wider band impedance transformers that can be used in the combining network 18 of the Doherty amplifier 10. For instance, as taught in U.S. Pat. No. 7,602,241 and illustrated in FIG. 2 (which corresponds to FIG. 3B of U.S. Pat. No. 7,602,241), the bandwidth limitation of a single $\lambda/4$ impedance transformer can be overcome by using cascaded-connected impedance transformers that perform the same impedance conversion at each of N frequencies. However, the improvement in bandwidth carries a cost of substantial physical size (i.e., the cascade-connected impedance transformer is 2 to 5 times longer than a $\lambda/4$ impedance transformer). This increase in physical size is not compatible with current space limitations on Printed Circuit Boards (PCBs) in modern base stations.

In a similar manner, as taught in U.S. Pat. Nos. 8,193,857 and 8,339,201 and illustrated in FIG. 3 (which corresponds to FIG. 1 of U.S. Pat. No. 8,193,857), a gradual tapered impedance transformer 22'', such as a Klopfenstein impedance transformer, rather than an impedance transformer having multiple impedance steps can be used to achieve wider bandwidth. However, the taper of the impedance transformer 22'' must be gradual and, as a result, the physical length of the impedance transformer 22'' would be considerably longer than a single $\lambda/4$ impedance transformer for a good tapered line. Therefore, again, the improvement in bandwidth carries a cost of substantial physical size. Also, due to the nature of the tapered structures, the size of the impedance transformer 22'' cannot be minimized by using common techniques such as bending.

To achieve multi-band performance, lumped element solutions have also been suggested as illustrated in FIGS. 4 and 5, where capacitors, circulators, varactors/diodes, hybrids, and controllers are implemented as part of the impedance transformation process to achieve wider bandwidth. Specifically, as taught in U.S. Pat. No. 8,314,654 and illustrated in FIG. 4 (which corresponds to FIG. 1 of U.S. Pat. No. 8,314,654), the $\lambda/4$ impedance transformer 20 can be replaced by a tunable impedance inverter 26 that uses capacitors as a tuner and a circulator and is controlled by a digital controller 28. FIG. 5, which corresponds to FIG. 2 of U.S. Pat. No. 8,314,654, shows another implementation where the splitter 12 is implemented as a hybrid coupler, the tunable impedance inverter 26 is implemented as a hybrid coupler, and offset line circuits 30 and 32 are used to couple the main and peaking amplifiers 14 and 16 to the tunable impedance inverter 26 and the $\lambda/4$ impedance transformer 22, as illustrated. One problem with the lumped element solutions proposed in U.S. Pat. No. 8,314,654 is that these solutions require a number of components and an elaborate system to implement, which would result in a costly and complex solution.

As such, there is a need for a wideband impedance transformer for a combining network of a Doherty power amplifier that is physically small and has low-complexity.

SUMMARY

The present disclosure relates to a low-complexity and potentially physically small wideband impedance transformer that can be used in a combining network of a wideband Doherty amplifier. In one embodiment, a wideband Doherty amplifier includes Doherty amplifier circuitry and a wideband combining network. The Doherty amplifier circuitry includes a main amplifier and a peaking amplifier. The wideband combining network has a first input coupled to an output of the main amplifier, a second input coupled to an output of the peaking amplifier, and an output. The wideband combining network is configured to combine a first amplified radio frequency signal from the output of the main amplifier and a second amplified radio frequency signal from the output of the peaking amplifier to provide a radio frequency output signal at the output of the wideband combining network. The wideband combining network includes a wideband quarter-wave impedance transformer that includes a quarter-wave impedance transformer and compensation circuitry connected in parallel with the quarter-wave impedance transformer at a low-impedance end of the low-impedance end of the quarter-wave impedance transformer. The compensation circuitry is configured to reduce a total quality factor of the wideband quarter-wave impedance transformer as compared to a quality factor of the quarter-wave impedance transformer. Since bandwidth is inversely proportional to quality factor, the bandwidth of the wideband quarter-wave impedance transformer, and thus a bandwidth of the wideband Doherty amplifier, is increased by reducing the total quality factor of the wideband quarter-wave impedance transformer.

In one embodiment, the compensation circuitry has a quality factor that is at least approximately equal to (i.e., approximately equal to or equal to) the quality factor of the quarter-wave impedance transformer such that the total quality factor of the wideband quarter-wave transformer is less than the quality factor of the quarter-wave impedance transformer.

In one embodiment, the compensation circuitry comprises two open stubs connected in parallel to the quarter-wave impedance transformer at the low-impedance end of the quarter-wave impedance transformer. Further, in one embodiment, a total quality factor of the two open stubs is at least approximately equal to the quality factor of the quarter-wave impedance transformer such that the total quality factor of the wideband quarter-wave impedance transformer is less than the quality factor of the quarter-wave impedance transformer.

In one embodiment, the compensation circuitry includes a half-wave transmission line connected in parallel to the quarter-wave impedance transformer at the low-impedance end of the quarter-wave impedance transformer such that: (a) a first portion of the half-wave transmission line that extends from the quarter-wave impedance transformer to a first end of the half-wave transmission line forms a first open stub having a first length and (b) a second portion of the half-wave transmission line that extends from the quarter-wave impedance transformer to a second end of the half-wave transmission line forms a second open stub having a second length. Further, in one embodiment, the first and second lengths are configured such that a total quality factor of the first and second open stub resonators is at least approximately equal to the quality factor of the quarter-wave impedance transformer such that the total quality factor of the wideband quarter-wave impedance transformer is less than the quality factor of the quarter-wave impedance transformer.

In one embodiment, the compensation circuitry includes two multilayer open stubs connected in parallel to the quarter-wave impedance transformer at the low-impedance end of the quarter-wave impedance transformer. Further, in one embodiment, a total quality factor of the two multilayer open stubs is at least approximately equal to the quality factor of the quarter-wave impedance transformer such that the total quality factor of the wideband quarter-wave impedance transformer is less than the quality factor of the quarter-wave impedance transformer.

In one embodiment, the compensation circuitry includes a lumped element equivalent circuit for two open stubs connected in parallel to the quarter-wave impedance transformer at the low-impedance end of the quarter-wave impedance transformer having a quality factor that is at least approximately equal to the quality factor of the quarter-wave impedance transformer such that the total quality factor of the wideband quarter-wave impedance transformer is less than the quality factor of the quarter-wave impedance transformer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 9A and 9B illustrate the multilevel open stubs of FIG. 8 in more detail according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 6:
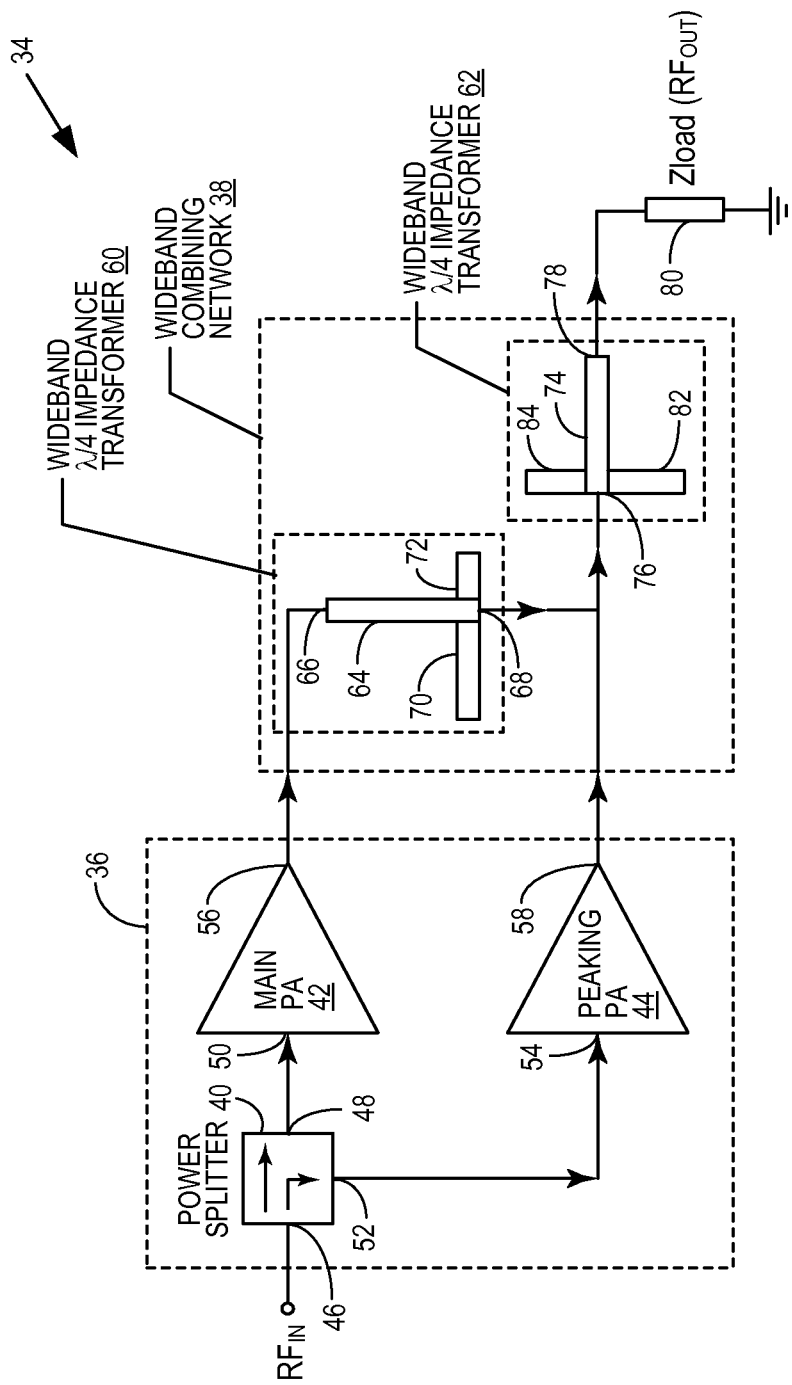
FIG. 6 illustrates a wideband Doherty amplifier having a wideband combining network including wideband impedance transformers according to one embodiment of the present disclosure.

Embodiments of a wideband Doherty amplifier having wideband (or multi-resonance) combining network are disclosed herein. As discussed below, in some embodiments, the wideband combining network achieves more than 20% and more preferably more than 25% relative radio frequency bandwidth while also being compact and cost effective. In this regard, FIG. 6 illustrates a wideband Doherty amplifier 34 according to one embodiment of the present disclosure. As illustrated, the wideband Doherty amplifier 34 includes Doherty amplifier circuitry 36 and a wideband combining network 38. In this particular embodiment, the Doherty amplifier circuitry 36 includes a splitter 40, a main power amplifier 42 (hereinafter "main amplifier 42"), and a peaking power amplifier 44 (hereinafter "peaking amplifier 44") connected as shown. Specifically, the splitter 40 has an input 46 that is configured to receive a Radio Frequency (RF) input signal of the wideband Doherty amplifier 34, a first output 48 that is coupled to an input 50 of the main amplifier 42, and a second output 52 that is coupled to an input 54 of the peaking amplifier 44. An output 56 of the main amplifier 42 is coupled to a first input of the wideband combining network 38, and an output 58 of the peaking amplifier 44 is coupled to a second input of the wideband combining network 38.

The wideband combining network 38 includes a first quarter-wave ($\lambda/4$) wideband impedance transformer 60 (hereinafter first wideband impedance transformer 60) and a second $\lambda/4$ wideband impedance transformer 62 (hereinafter "second wideband impedance transformer 62"). The first wideband impedance transformer 60 includes a quarter-wave ($\lambda/4$)

impedance transformer 64 having an input (or first end) 66 coupled to the output 56 of the main amplifier 42 and an output (or second end) 68. Notably, as discussed below, the output 68, or second end, of the λ/4 impedance transformer 64 is a low-impedance end of the λ/4 impedance transformer 64 (i.e., an impedance at the input 66 of the λ/4 impedance transformer 64 is greater than an impedance at the output 68 of the λ/4 impedance transformer 64). The λ/4 impedance transformer 64 may be implemented as a transmission line, e.g., a micro strip or a coaxial line. In addition to the λ/4 impedance transformer 64, the first wideband impedance transformer 60 includes compensation circuitry that is connected in parallel to the λ/4 impedance transformer 64 at the low-impedance end of the λ/4 impedance transformer 64, where the compensation circuitry is configured to reduce a total quality factor ($Q_{T1}$) of the first wideband impedance transformer 60 as compared to a quality factor ($Q_{\lambda/4,1}$) of the λ/4 impedance transformer 64. As discussed below, reducing the total quality factor ($Q_{T1}$) of the first wideband impedance transformer 60 increases a bandwidth of the first wideband impedance transformer 60 as compared to a bandwidth of the λ/4 impedance transformer 64.

In this particular embodiment, the compensation circuitry is implemented as two parallel open stubs 70 and 72 that form a parallel-tuned circuit that reduces the total quality factor ($Q_{T1}$) of the first wideband impedance transformer 60. Notably, a stub is a length of transmission line (or waveguide) that is connected at one end only. An open stub is a stub whose free end is left open-circuit. As discussed below, the electrical lengths of the parallel open stubs 70 and 72 are configured to provide a desired quality factor ($Q_{C,1}$) that is at least approximately equal to (i.e., equal to or approximately equal to) the quality factor ($Q_{\lambda/4,1}$) of the λ/4 impedance transformer 64. The quality factor ($Q_{C,1}$), which is a total quality factor of the two parallel open stubs 70 and 72 (i.e., the quality factor of the compensation circuitry), compensates the quality factor ($Q_{\lambda/4,1}$) of the λ/4 impedance transformer 64 to thereby reduce the total quality factor ($Q_{T1}$) of the first wideband impedance transformer 60. This in turn increases the bandwidth of the first wideband impedance transformer 60. In this manner, a wideband multi-resonance circuit is achieved.

In one embodiment, the parallel open stubs 70 and 72 are implemented as a half-wave (λ/2) transmission line, where a tapping point of the λ/2 transmission line (i.e., the point along the λ/2 transmission line that is connected to the λ/4 impedance transformer 64) is selected to provide the desired electrical lengths for the parallel open stubs 70 and 72. In other words, a first portion of the λ/2 transmission line that extends from the λ/4 impedance transformer 64 to one end of the λ/2 transmission line forms one of the parallel open stubs 70 and 72, whereas a second portion of the λ/2 transmission line that extends from the λ/4 impedance transformer 64 to the other end of the λ/2 transmission line forms the other one of the parallel open stubs 70 and 72. The transmission line may more specifically be, for example, a micro strip, a coaxial line, or the like.

The second wideband impedance transformer 62 includes a λ/4 impedance transformer 74 having an input (or first end) 76 coupled to the output 58 of the peaking amplifier 44 and the output 68 of the λ/4 transmission line 64 and an output (or second end) 78 that is configured to be coupled to (or coupled to) a load 80 of the wideband Doherty amplifier 34. Notably, as discussed below, the input 76, or first end, of the λ/4 impedance transformer 74 is a low-impedance end of the λ/4 impedance transformer 74 (i.e., an impedance at the input 76 of the λ/4 impedance transformer 74 is less than an impedance at the output 78 of the λ/4 impedance transformer 74).

The λ/4 impedance transformer 74 may be implemented as a transmission line, e.g., a micro strip or a coaxial line. In addition to the λ/4 impedance transformer 74, the second wideband impedance transformer 62 includes compensation circuitry that is connected in parallel to the λ/4 impedance transformer 74 at the low-impedance end of the λ/4 impedance transformer 74, where the compensation circuitry is configured to reduce a total quality factor ($Q_{T2}$) of the second wideband impedance transformer 62 as compared to a quality factor ($Q_{\lambda/4,2}$) of the λ/4 impedance transformer 74. As discussed below, reducing the total quality factor ($Q_{T2}$) of the second wideband impedance transformer 62 increases a bandwidth of the second wideband impedance transformer 62 as compared to a bandwidth of the λ/4 impedance transformer 74.

In this particular embodiment, the compensation circuitry is implemented as two parallel open stubs 82 and 84 that form a parallel-tuned circuit that reduces the total quality factor ($Q_{T2}$) of the second wideband impedance transformer 62. As discussed below, the electrical lengths of the parallel open stubs 82 and 84 are configured to provide a desired quality factor ($Q_{C,2}$) that is at least approximately equal to (i.e., equal to or approximately equal to) the quality factor ($Q_{\lambda/4,2}$) of the λ/4 impedance transformer 74. The quality factor ($Q_{C,2}$), which is a total quality factor of the two parallel open stubs 82 and 84 (i.e., the quality factor of the compensation circuitry), compensates the quality factor ($Q_{\lambda/4,2}$) of the λ/4 impedance transformer 74 to thereby reduce the total quality factor ($Q_{T2}$) of the second wideband impedance transformer 62. This in turn increases the bandwidth of the second wideband impedance transformer 62. In this manner, a wideband multi-resonance circuit is achieved.

In one embodiment, the parallel open stubs 82 and 84 are implemented as a λ/2 transmission line, where a tapping point of the λ/2 transmission line (i.e., the point along the λ/2 transmission line that is connected to the λ/4 impedance transformer 74) is selected to provide the desired electrical lengths for the parallel open stubs 82 and 84. In other words, a first portion of the λ/2 transmission line that extends from the λ/4 impedance transformer 74 to one end of the λ/2 transmission line forms one of the parallel open stubs 82 and 84, whereas a second portion of the λ/2 transmission line that extends from the λ/4 impedance transformer 74 to the other end of the λ/2 transmission line forms the other one of the parallel open stubs 82 and 84. The transmission line may more specifically be, for example, a micro strip, a coaxial line, or the like. Further, in some implementations, the parallel open stubs 82 and 84 can be straight or can be bent, or meandered, to save board space on a corresponding Printed Circuit Board (PCB).

The manner in which the parallel open stubs 70 and 72 reduce the total, or effective, quality factor ($Q_{T1}$) of the first wideband impedance transformer 60 (and likewise the manner in which the parallel open stubs 82 and 84 reduce the total, or effective, quality factor ($Q_{T2}$) of the second wideband impedance transformer 62) can be described as follows. The quality factor (Q) of a circuit is inversely proportional to relative bandwidth (BW), i.e.:

$$BW = 1/Q \tag{1}$$

where $$BW = \frac{\Delta f}{f_0},$$

Δf is an absolute frequency bandwidth (Hertz (Hz)) of the circuit, and $f_0$ is a central frequency of the absolute frequency bandwidth of the circuit. Therefore, the relative bandwidth (BW) of the circuit can be increased by reducing the quality factor (Q) of the circuit. One technique that can be used to reduce the quality factor (Q) of a series-tuned circuit is to add an appropriate parallel-tuned circuit with the same or approximately the same quality factor (Q). For instance, for a series-tuned circuit, the reactance (i.e., the imaginary part) of the impedance of the series-tuned circuit can be defined in terms of Q as:

$$\text{Im}[Z_{in}] = 2QR*\left(\frac{\Delta f}{f_0}\right), \quad (2)$$

where $Z_{in}$ is the impedance of the series-tuned circuit and R is the resistance of the lumped element equivalent circuit of the series-tuned circuit. Conversely, for a parallel-tuned circuit, the reactance (i.e., the imaginary part) of the impedance of the parallel-tuned circuit can be defined in terms of Q as:

$$\text{Im}[Z_{in}] = -2QR*\left(\frac{\Delta f}{f_0}\right), \quad (3)$$

where $Z_{in}$ is the impedance of the parallel-tuned circuit and R is the resistance of the lumped element equivalent circuit of the parallel-tuned circuit. Equations (2) and (3) further validate that the effective quality factor (Q) of a series-tuned circuit can be minimized by adding a parallel-tuned circuit to the series-tuned circuit.

A λ/4 impedance transformer, when transforming down in impedance, looks like a series tuned circuit. Therefore, the effective quality factors of the λ/4 impedance transformers 64 and 74 (i.e., the total quality factors of the first and second wideband impedance transformers 60 and 62) can be minimized by connecting corresponding parallel-tuned circuits having quality factors (Q) that are at least approximately equal to the quality factors ($Q_{\lambda/4,1}$) and ($Q_{\lambda/4,2}$) of the λ/4 impedance transformers 64 and 74 to the low-impedance ends of the λ/4 impedance transformers 64 and 74, respectively. By doing so, according to Equation (1), the bandwidths of the first and second wideband impedance transformers 60 and 62 are increased.

Figure 7:
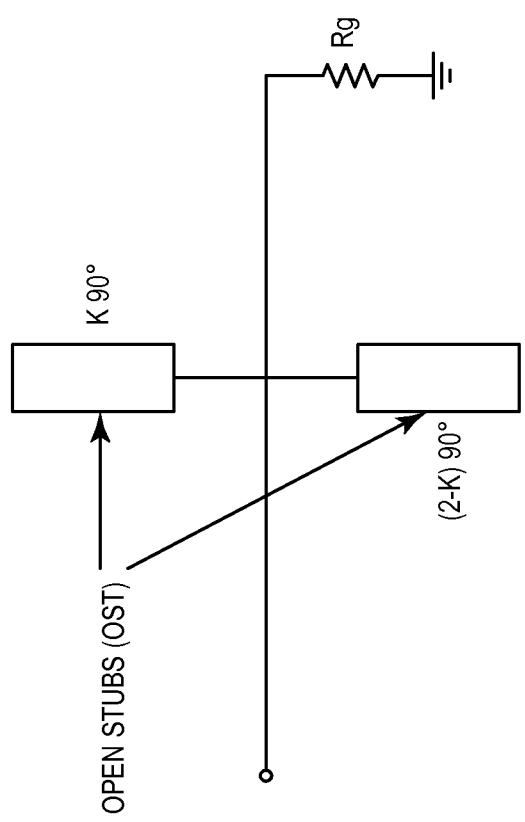
FIG. 7 illustrates a tapping factor (K) that defines lengths of parallel open stubs that provide a desired Quality factor (Q)

The appropriate lengths of the parallel open stubs 70, 72, 82, and 84 for the optimum Q that minimizes the total quality factors ($Q_{T1}$) and ($Q_{T2}$) of the first and second wideband impedance transformers 60 and 62 can be determined by calculating a tapping factor (K) according to a parallel-tuned equivalent circuit as illustrated in FIG. 7. When the parallel open stubs 70 and 72 are implemented as a λ/2 transmission line as discussed above, the tapping factor (K) for the parallel open stubs 70 and 72 defines a ratio of the lengths of the parallel open stubs 70 and 72. Likewise, when the parallel open stubs 82 and 84 are implemented as a λ/2 transmission line as discussed above, the tapping factor (K) for the parallel open stubs 82 and 84 defines a ratio of the lengths of the parallel open stubs 82 and 84. The tapping factor (K) for the parallel-tuned equivalent circuit can be derived from the equation:

$$Q = \left(\frac{\pi}{2}\right)\left(\frac{R_g}{Z_{ost}}\right)\left[\frac{1}{\cos^2(K90°)}\right], \quad (4)$$

where $0<K<1$, $Z_{ost}$ is the characteristic impedance of the open stubs, K is the tapping factor, and $R_g$ is the output load impedance.

Using Equation (4), the optimum tapping factor (K) for the parallel open stubs 70 and 72 can be calculated by setting Q to the quality factor ($Q_{\lambda/4,1}$) of the λ/4 impedance transformer 64. Likewise, the optimum tapping factor (K) for the parallel open stubs 82 and 84 can be calculated by setting Q to the quality factor ($Q_{\lambda/4,2}$) of the λ/4 impedance transformer 74. Once the optimum tapping factors (K) are determined, the appropriate lengths of the parallel open stubs 70, 72, 82, and 84 are known. The electrical lengths of each of the parallel open stubs 70, 72, 82, and 84 can be further optimized to improve the multi-resonance of the first and second wideband impedance transformers 60 and 62 to further increase the bandwidth of the wideband combining network 38. Note that while the appropriate electrical lengths of the parallel open stubs 70, 72, 82, and 84 can be computed as described above, other techniques for determining the appropriate electrical lengths of the parallel open stubs 70, 72, 82, and 84 can be used. For example, the optimal electrical lengths of the parallel open stubs 70, 72, 82, and 84 may be determined by simulation.

While in the embodiments discussed above the compensation circuitry for the λ/4 wave impedance transformers 64 and 74 are the parallel open stubs 70, 72, 82, and 84, the compensation circuitry is not limited thereto. In another embodiment, one or more, or possibly all, of the parallel open stubs 70, 72, 82, and 84 are replaced by lumped-element equivalent circuits. The lumped-element equivalent circuits for the parallel open stubs 70, 72, 82, and 84 can be determined using any suitable technique and, such techniques are well-known in the art. Importantly, these lumped-element equivalent circuits are in addition to the λ/4 impedance transformers 64 and 74 (i.e., are used to compensate the quality factors of the λ/4 impedance transformers 64 and 74) and do not replace the λ/4 impedance transformers 64 and 74. The lumped-element equivalent circuits may include capacitors and/or inductors.

Figure 8:
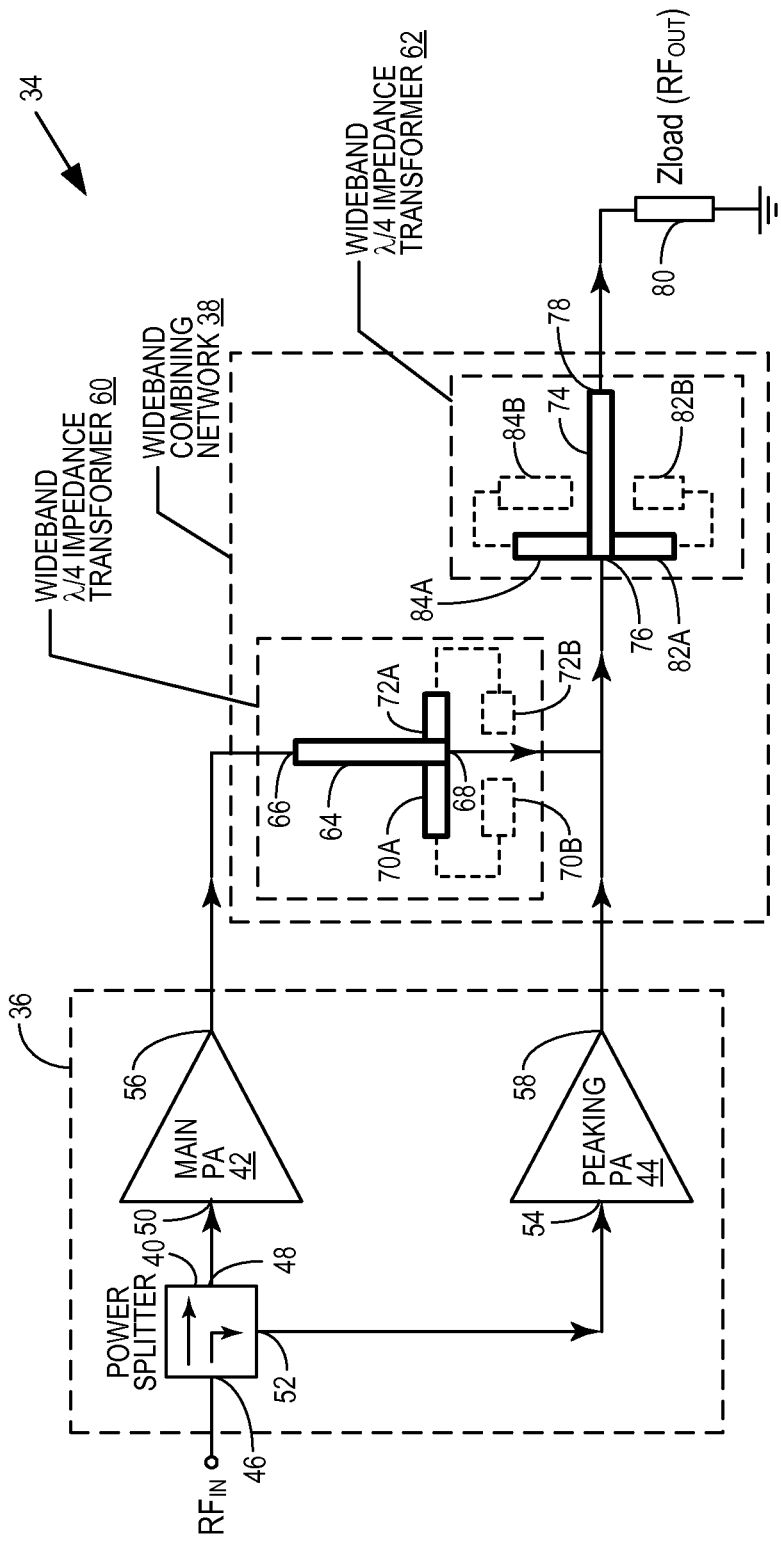
FIG. 8 illustrates the wideband Doherty amplifier in which the wideband combining network is implemented using multilevel open stubs according to another embodiment of the present disclosure.

In some implementations, the physical size of the parallel open stubs 70, 72, 82, and 84 may be too large. FIG. 8 illustrates the wideband Doherty amplifier 34 according to another embodiment in which the parallel open stubs 70, 72, 82, and 84 are implemented as multi-layer parallel open stubs. This embodiment may be particularly beneficial for embodiments where the electrical lengths of one or more of the parallel open stubs 70, 72, 82, and 84 is large (e.g., greater than λ/4). In this embodiment, the wideband Doherty amplifier 34, or at least the wideband combining network 38, is implemented on a PCB having multiple layers. In order to reduce the size of the parallel open stubs 70, 72, 82, and 84, the parallel open stubs 70, 72, 82, and 84 are implemented as multi-layer coupled transmission lines above a ground plane on the PCB.

Specifically, in this example, the parallel open stub 70 includes a first portion 70A of the corresponding multi-layer coupled transmission line on a first layer of the PCB and a second portion 70B of the multi-layer coupled transmission line on a second layer of the PCB. Likewise, the parallel open stub 72 includes a first portion 72A of the corresponding multi-layer coupled transmission line on the first layer of the PCB and a second portion 72B of the multi-layer coupled transmission line on the second layer of the PCB. The parallel open stub 82 includes a first portion 82A of the corresponding multi-layer coupled transmission line on the first layer of the PCB and a second portion 82B of the multi-layer coupled transmission line on the second layer of the PCB. Likewise, the parallel open stub 84 includes a first portion 84A of the corresponding multi-layer coupled transmission line on the first layer of the PCB and a second portion 84B of the multi-layer coupled transmission line on the second layer of the PCB. Note that while only two layers are used in this example, the multi-layer coupled transmission lines may be implemented using any number of two or more layers.

FIGS. 9A and 9B illustrate the first wideband impedance transformer 60 of FIG. 8 in more detail according to one embodiment of the present disclosure. This discussion is also applicable to the second wideband impedance transformer 62 of FIG. 8. Specifically, FIG. 9A is a top-down view that shows the λ/4 impedance transformer 64 and the first portions 70A and 72A of the parallel open stubs 70 and 72 on the top metal layer of the PCB. The first portion 70A has a length L1, the second portion 72A has a length L2, and a total length of the first portions 70A and 70B is a length L3. The outer ends of the first portions 70A and 72A are coupled to the second portions 70B and 72B (which are on a lower metal layer of the PCB) by vias 86 and 88, respectively, as illustrated in FIG. 9B.

More specifically, FIG. 9B illustrates a cross-section of the structure in FIG. 9A along the line A-A. As illustrated, the PCB (hereinafter PCB 90) includes a first metal layer 92, a first substrate layer 94, a second metal layer 96, a second substrate layer 98, and a ground plane 100 arranged as shown. The first portions 70A and 72A of the multi-layer coupled transmissions lines forming the parallel open stubs 70 and 72 are formed in the first metal layer 92. Likewise, the second portions 70B and 72B of the multi-layer coupled transmissions lines forming the parallel open stubs 70 and 72 are formed in the second metal layer 96. The second portions 70B and 72B have lengths L1' and L2', respectively, where the lengths L1' and L2' may be different than the lengths L1 and L2 of the first portions 70A and 72A. The first portion 70A is coupled to the second portion 70B of the multi-layer coupled transmission line forming the parallel open stub 70 by the vias 86. Likewise, the first portion 72A is coupled to the second portion 72B of the multi-layer coupled transmission line forming the parallel open stub 72 by the vias 88.

Mutual couplings between the multiple layers (e.g., the mutual couplings between the first and second portions 72A and 72B, between the first and second portions 74A and 74B, etc.) of the multi-layer transmission lines increases the inductance value in a smaller board space. The distance between the two layers of the multi-layer coupled transmission lines (i.e., a height H1 of the first substrate layer 94 that separates the first and second metal layers 92 and 96) will determine the amount of inductance created with the multi-layer coupled transmission lines due to the change in mutual coupling. Inductance can also be controlled by the height of the lower metal layer 96 above the ground plane 100 (i.e., a height H2 of the second substrate layer 98). In one particular embodiment, the multi-layer coupled transmission lines for each parallel open stub 70 and 72 have the same width and typically unequal lengths with both metal layers 92 and 96 having the same height. With multi-layer coupled transmission lines, the same performance can be achieved with one fourth of the length of a single layer microstrip transmission line. This suggests that only one fourth of the board area will be consumed to achieve the same performance if a multi-layer coupled transmission line is used as opposed to using a single layer microstrip structure.

Figure 1:
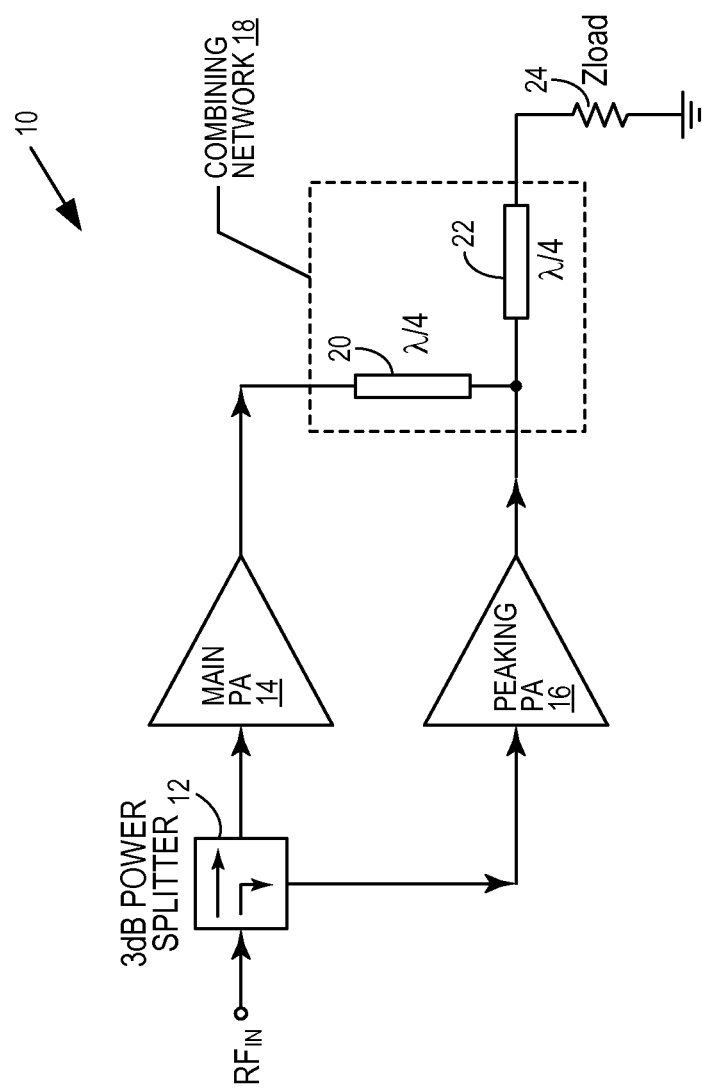
FIG. 1 illustrates a conventional Doherty amplifier.
Figure 2:
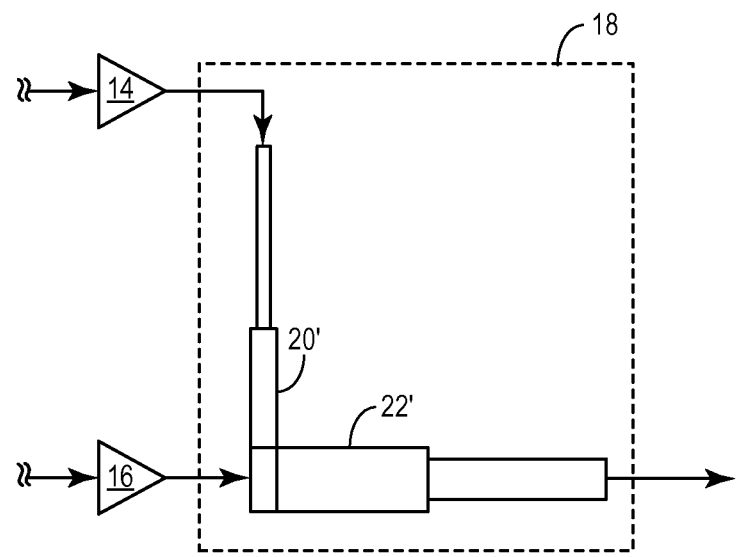
FIG. 2 illustrates a first prior art solution for increasing a bandwidth of the impedance transformers in the combining network of the conventional Doherty amplifier.
Figure 3:
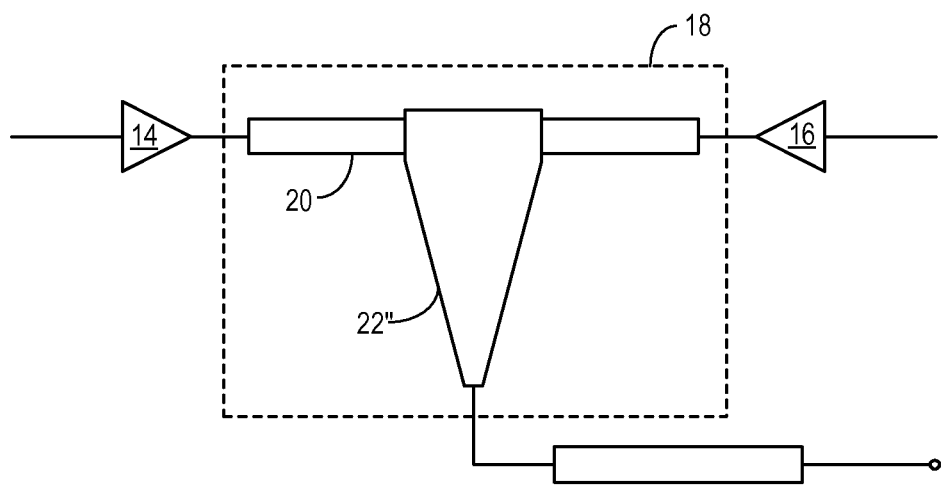
FIG. 3 illustrates a second prior art solution for increasing the bandwidth of an impedance transformer in the combining network of the conventional Doherty amplifier.
Figure 4:
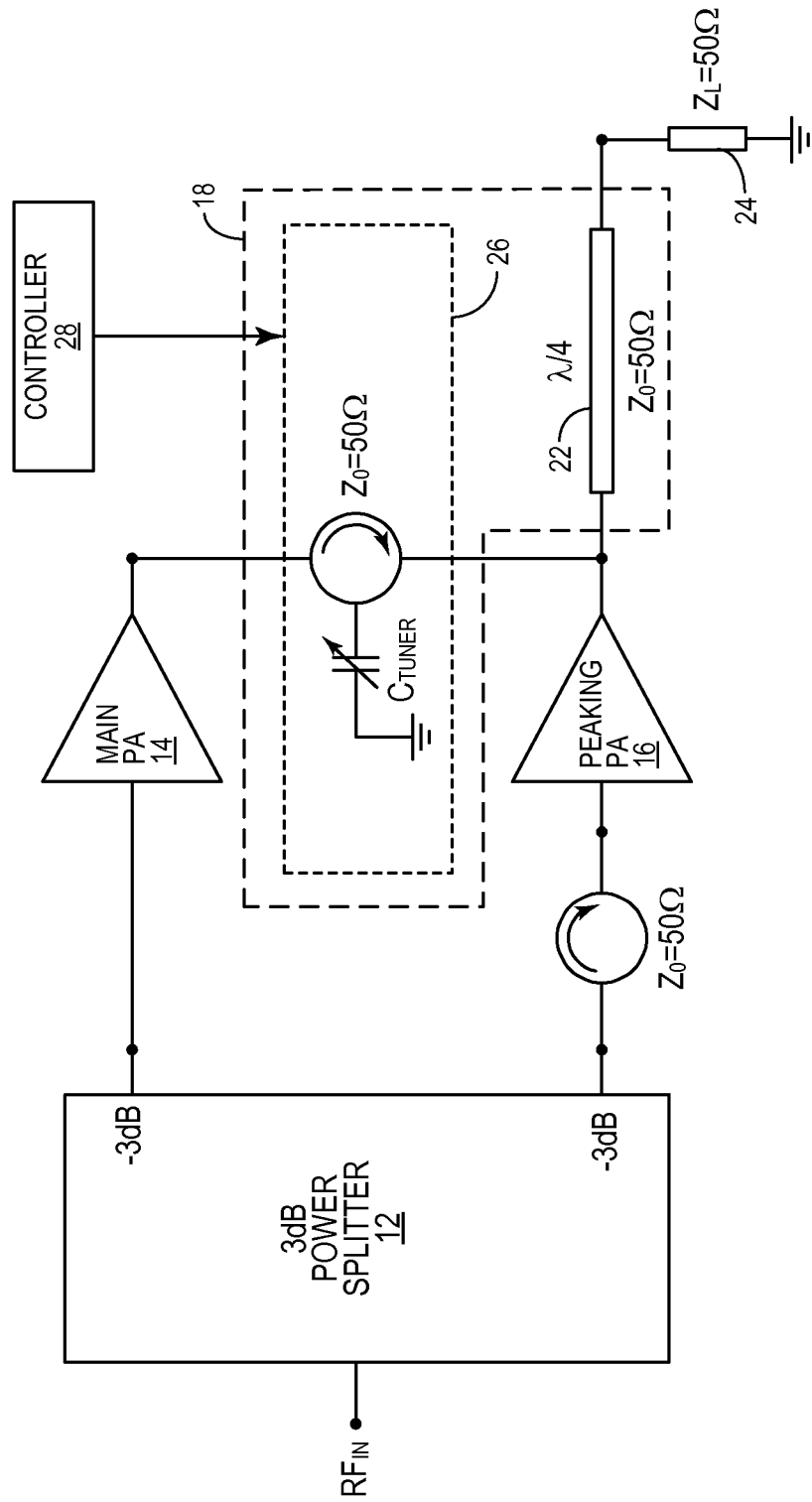
FIGS. 4 and 5 illustrate prior art solutions for addressing the bandwidth limitations of the conventional Doherty amplifier by replacing an impedance transformer in the combining network of the conventional Doherty amplifier with lumped element circuits.
Figure 5:
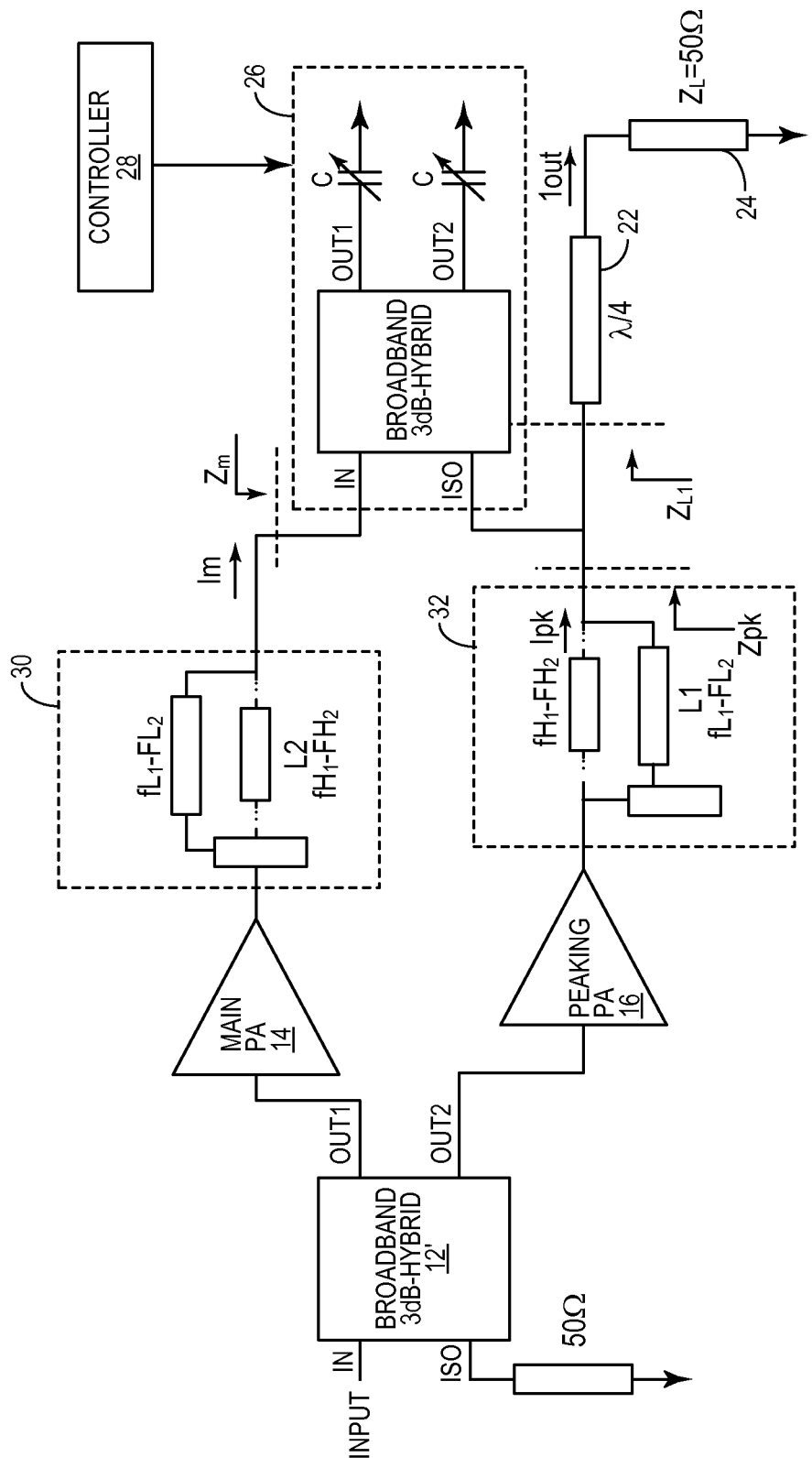
Figure 10:
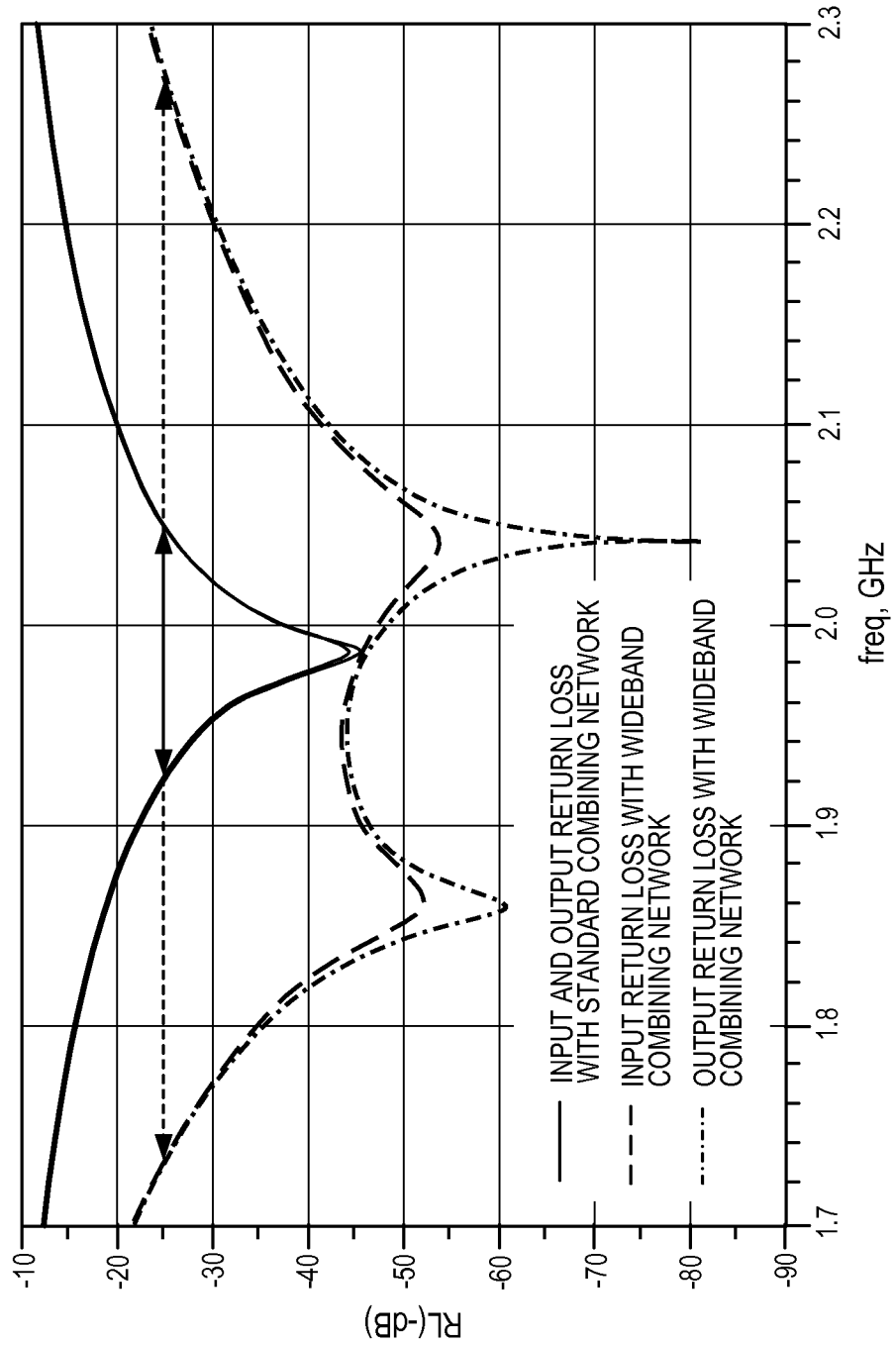
FIG. 10 illustrates simulated input and output Return Loss (RL) for one embodiment of the wideband combining network of FIGS. 6 and 8 as compared to that of the standard combining network of FIG. 1.

FIG. 10 illustrates simulated input and output Return Loss (RL) for one embodiment of the wideband combining network 38 disclosed herein as compared to the combining network 18 of the conventional Doherty amplifier 10 of FIG. 1. This plot clearly indicates that the wideband combining network 38 provides a relative bandwidth of greater than 25%.

It is clear that the proposed solution described herein provides wider relative bandwidth with >20% more bandwidth than typical designs, by minimizing the band limiting characteristics of the currently existing Doherty architectures. This enables one amplifier circuit to be simultaneously used to cover multiple frequency bands. Additionally, some of the embodiments disclosed herein provide a technique to minimize the physical size of the wideband design. Currently existing wideband techniques become difficult to implement on a practical power amplifier design due to the size of the wideband circuit structures. Therefore the technique described here provides a solution for a wideband Doherty design realized in a practical board space on a printed circuit board.

The following acronyms are used throughout this disclosure.
λ Wavelength
BW Bandwidth
Hz Hertz
PA Power Amplifier
PCB Printed Circuit Board
Q Quality Factor
RF Radio Frequency
RL Return Loss Those skilled in the art will recognize improvements and modifications to the preferred embodiments of the present disclosure. All such improvements and modifications are considered within the scope of the concepts disclosed herein and the claims that follow.

What is claimed is:
1. A wideband Doherty amplifier, comprising:
Doherty amplifier circuitry comprising a main amplifier and a peaking amplifier; and
a combining network having a first input coupled to an output of the main amplifier, a second input coupled to an output of the peaking amplifier, and an output, the combining network configured to combine a first amplified radio frequency signal from the output of the main amplifier and a second amplified radio frequency signal from the output of the peaking amplifier to provide a radio frequency output signal of the wideband Doherty amplifier;
wherein the combining network comprises a wideband quarter-wave impedance transformer comprising:
a quarter-wave impedance transformer; and
compensation circuitry comprising two open stubs connected in parallel with the quarter-wave impedance transformer at a low-impedance end of the quarter-wave impedance transformer, the compensation circuitry configured to reduce a total quality factor of the wideband quarter-wave impedance transformer as compared to a quality factor of the quarter-wave impedance transformer.

2. The wideband Doherty amplifier of claim 1 wherein:
the compensation circuitry has a quality factor that is at least approximately equal to the quality factor of the quarter-wave impedance transformer such that the total quality factor of the wideband quarter-wave impedance transformer is less than the quality factor of the quarter-wave impedance transformer.

3. The wideband Doherty amplifier of claim 1 wherein a total quality factor of the two open stubs is at least approximately equal to the quality factor of the quarter-wave impedance transformer such that the total quality factor of the wideband quarter-wave impedance transformer is less than the quality factor of the quarter-wave impedance transformer.

4. The wideband Doherty amplifier of claim 1 wherein the two open stubs are implemented by multi-layer transmission lines.

5. The wideband Doherty amplifier of claim 4 wherein a total quality factor of the two open stubs is at least approximately equal to the quality factor of the quarter-wave impedance transformer such that the total quality factor of the wideband quarter-wave impedance transformer is less than the quality factor of the quarter-wave impedance transformer.

6. The wideband Doherty amplifier of claim 1 wherein at least the combining network is implemented on a printed circuit board, and the two open stubs comprise:
  a first open stub comprising a first portion in a first metal layer of the printed circuit board and a second portion in a second metal layer of the printed circuit board, wherein the first and second portions are connected by one or more vias; and
  a second open stub comprising a first portion in the first metal layer of the printed circuit board and a second portion in the second metal layer of the printed circuit board, wherein the first and second portions of the second open stub are connected by one or more vias.

7. A wideband Doherty amplifier comprising:
Doherty amplifier circuitry comprising a main amplifier and a peaking amplifier; and
a combining network having a first input coupled to an output of the main amplifier, a second input coupled to an output of the peaking amplifier, and an output, the combining network configured to combine a first amplified radio frequency signal from the output of the main amplifier and a second amplified radio frequency signal from the output of the peaking amplifier to provide a radio frequency output signal of the wideband Doherty amplifier;
wherein the combining network comprises a wideband quarter-wave impedance transformer comprising:
  a quarter-wave impedance transformer; and
  compensation circuitry comprising a half-wave transmission line connected in parallel to the quarter-wave impedance transformer at the low-impedance end of the quarter-wave impedance transformer such that:
  a first portion of the half-wave transmission line that extends from the quarter-wave impedance transformer to a first end of the half-wave transmission line forms a first open stub having a first length; and
  a second portion of the half-wave transmission line that extends from the quarter-wave impedance transformer to a second end of the half-wave transmission line forms a second open stub having a second length, the compensation circuitry configured to reduce a total quality factor of the wideband quarter-wave impedance transformer as compared to a quality factor of the quarter-wave impedance transformer.

8. The wideband Doherty amplifier of claim 7 wherein the first and second lengths are configured such that a quality factor of the first and second open stubs is at least approximately equal to the quality factor of the quarter-wave impedance transformer such that the total quality factor of the wideband quarter-wave impedance transformer is less than the quality factor of the quarter-wave impedance transformer.

9. The wideband Doherty amplifier of claim 7 wherein the half-wave transmission line is a micro strip.

10. The wideband Doherty amplifier of claim 7 wherein the half-wave transmission line is coaxial line.

11. The wideband Doherty amplifier of claim 7 wherein the half-wave transmission line is bent or meandered.

12. The wideband Doherty amplifier of claim 7 wherein the first and second lengths are optimized to maximize a bandwidth of the wideband quarter-wave impedance transformer.

13. A wideband Doherty amplifier comprising:
Doherty amplifier circuitry comprising a main amplifier and a peaking amplifier; and
a combining network having a first input coupled to an output of the main amplifier, a second input coupled to an output of the peaking amplifier, and an output, the combining network configured to combine a first amplified radio frequency signal from the output of the main amplifier and a second amplified radio frequency signal from the output of the peaking amplifier to provide a radio frequency output signal of the wideband Doherty amplifier;
wherein the combining network comprises a wideband quarter-wave impedance transformer comprising:
  a quarter-wave impedance transformer; and
  compensation circuitry comprising a lumped element equivalent circuit for two open stubs connected in parallel to the quarter-wave impedance transformer at the low-impedance end of the quarter-wave impedance transformer having a quality factor that is at least approximately equal to the quality factor of the quarter-wave impedance transformer such that the total quality factor of the wideband quarter-wave impedance transformer is less than the quality factor of the quarter-wave impedance transformer.

14. The wideband Doherty amplifier of claim 1 wherein the quarter-wave impedance transformer has an input coupled to the output of the main amplifier and an output that corresponds to the low-impedance end of the quarter-wave impedance transformer.

15. The wideband Doherty amplifier of claim 14 wherein the combining network further comprises a second wideband quarter-wave impedance transformer comprising:
  a second quarter-wave impedance transformer having an input coupled to the output of the peaking amplifier and the output of the quarter-wave impedance transformer and an output that corresponds to a low-impedance end of the second quarter-wave impedance transformer; and
  second compensation circuitry connected in parallel with the second quarter-wave impedance transformer at the low-impedance end of the second quarter-wave impedance transformer, the second compensation circuitry configured to reduce a total quality factor of the second wideband quarter-wave impedance transformer as compared to a quality factor of the second quarter-wave impedance transformer.

16. The wideband Doherty amplifier of claim 1 wherein the wideband quarter-wave impedance transformer has a bandwidth that is greater than 20% radio bandwidth relative to a central frequency of operation.

17. The wideband Doherty amplifier of claim 1 wherein the wideband quarter-wave impedance transformer has a bandwidth that is greater than 25% radio bandwidth relative to a central frequency of operation.

18. The wideband Doherty amplifier of claim 1 wherein the Doherty amplifier circuitry comprises:
  a splitter having an input, a first output, and a second output, the splitter configured to receive a radio frequency input signal at the input of the splitter and split the radio frequency input signal to provide a first radio frequency output signal at the first output and a second radio frequency output signal at the second output;

the main amplifier having an input coupled to the first output of the splitter, the main amplifier configured to amplify the first radio frequency output signal received at the input of the main amplifier from the first output of the splitter to provide a first amplified radio frequency signal at the output of the main amplifier; and the peaking amplifier having an input coupled to the second output of the splitter, the peaking amplifier configured to amplify the second radio frequency output signal received at the input of the peaking amplifier from the second output of the splitter to provide a second amplified radio frequency signal at the output of the peaking amplifier.

19. The wideband Doherty amplifier of claim 1 wherein the wideband Doherty amplifier is a multi-way Doherty amplifier.

\* \* \* \* \*